United States Patent
Ren et al.

(10) Patent No.: US 7,446,012 B2
(45) Date of Patent: Nov. 4, 2008

(54) LATERAL PNP TRANSISTOR AND THE METHOD OF MANUFACTURING THE SAME

(75) Inventors: Chong Ren, Shanghai (CN); Xian-Feng Liu, Shanghai (CN); Bin Qiu, Shanghai (CN)

(73) Assignee: BCD Semiconductor Manufacturing Limited, George Town, Grand Cayman (KY)

( * ) Notice: Subject to any disclaimer, the term of this patent is extended or adjusted under 35 U.S.C. 154(b) by 24 days.

(21) Appl. No.: 11/335,623

(22) Filed: Jan. 20, 2006

(65) Prior Publication Data
US 2006/0118881 A1 Jun. 8, 2006

Related U.S. Application Data

(62) Division of application No. 10/930,851, filed on Sep. 1, 2004, now abandoned.

(51) Int. Cl.
*H01L 21/265* (2006.01)
*H01L 29/72* (2006.01)

(52) U.S. Cl. .............. 438/336; 438/206; 438/294; 438/335; 438/339; 257/593; 257/596; 257/592; 257/578; 257/E21.507; 257/E21.555; 257/E21.609; 257/E27.078; 257/E29.187

(58) Field of Classification Search .......... 438/314, 438/350, 206, 294, 335, 336, 339
See application file for complete search history.

(56) References Cited

U.S. PATENT DOCUMENTS

| | | | | |
|---|---|---|---|---|
| 4,624,046 A * | 11/1986 | Shideler et al. | ............ | 438/336 |
| 4,966,858 A * | 10/1990 | Masquelier et al. | ......... | 438/294 |
| 5,156,989 A * | 10/1992 | Williams et al. | ............ | 438/206 |
| 5,179,432 A * | 1/1993 | Husher | ........................ | 257/593 |
| 5,187,109 A * | 2/1993 | Cook et al. | .................. | 438/339 |
| 5,326,710 A * | 7/1994 | Joyce et al. | .................. | 438/203 |
| 5,360,750 A * | 11/1994 | Yang | .......................... | 438/335 |
| 5,387,553 A * | 2/1995 | Moksvold et al. | ........... | 438/339 |
| 6,372,595 B1 * | 4/2002 | Thiel et al. | .................. | 438/335 |
| 6,611,044 B2 * | 8/2003 | Pruijmboom et al. | ....... | 257/588 |
| 6,780,725 B2 * | 8/2004 | Fujimaki | ..................... | 438/313 |

* cited by examiner

*Primary Examiner*—Michael S Lebentritt
(74) *Attorney, Agent, or Firm*—Muncy, Geissler, Olds & Lowe, PLLC

(57) ABSTRACT

The present invention relates to a lateral PNP transistor and the method of manufacturing the same. The medium doping N-type base area and the light doping P⁻ collector area were first introduced in the structure before the formation of P⁺ doping emitter area and the collector area. The emitter-base-collector doping profile in the lateral and the base width of LPNP were similar to NPN. The designer can optimize the doping profile and area size of each area according to the request of the current gain (Hfe), collector-base breakdown voltage (BVceo), and early voltage (VA) of LPNP transistor. These advantages may cause to reduce the area and enhance performance of the LPNP transistor.

2 Claims, 5 Drawing Sheets

LATERAL PNP TRANSISTOR AND THE METHOD OF MANUFACTURING THE SAME

This application is a Divisional of co-pending application Ser. No. 10/930,851, filed on Sep. 1, 2004, and for which priority is claimed under 35 U.S.C. § 120; the entire contents of all are hereby incorporated by reference.

FIELD OF THE INVENTION

This invention is related to a lateral PNP transistor and the method of manufacturing the same. The invented lateral PNP transistor is mainly aimed at power driver and power output application to reduce the chip area and enhance the performance of products.

BACKGROUND OF THE INVENTION

The common tendency of microelectronic circuit is to integrate more functions on the chip in order to increase the widely applications of electric circuit, reduce the size and power consumption of system, and lower the price of devices. Although the bipolar transistor and bipolar process technology do not suit all applications, they are some key foundations for other extended process technology, like BiCMOS and BiCDMOS, for a long time.

Generally there is no good PNP transistor in most bipolar processes, because this process generally is designed to make the best performance of vertical NPN transistor. Although the vertical PNP may be added into the manufacturing process, it will increase the process complexity, number of mask, and cost.

The lateral PNP (LPNP) transistor is the P-type device mainly used, because the requests about high frequency performance, current driving capability, packing density and so on for LPNP transistor are lower than vertical NPN transistor.

Generally, the LPNP transistor is made by two nearby P-type areas which diffused into epi layer with one P-type collector surrounding another P-type emitter. In the most processes, the base is formed by N-type epi layer and $N^+$ contact area. Collector and emitter are separated by the field oxide.

Because the bipolar process is generally aimed to optimize the performance of NPN transistor, the lateral PNP transistor is made by the layers that also used by NPN transistor. FIG. 1 is the enlarged cross section of general LPNP transistor. Referring to FIG. 1, a buried N layer 11 is formed on a P-type doping substrate 10. The N-type epi layer 12 is grown on buried N layer 11 and the N-type field implant layer 120 is formed on epi layer 12. Then a $P^+$ isolation area 121 is diffused from the surface of field implant layer 120 to P-type buried area 111 on substrate 10. The buried layer 11 is surrounded by isolation area 121 and P-type buried area 111. The epi layer 12 that is surrounded by isolation area 121 has numerous diffusion areas, such as N-type slot area 134 (generally is $N^+$ sinker of NPN or N-well of CMOS) which diffuses from the surface of epi oxide layer 14 to the edge of buried layer 11, $P^+$-type emitter area 132 and $P^+$-type collector area 131 which surround and separated with emitter area 132 (generally is P-base of NPN or $P^+$ of CMOS). The $N^+$-type area 135 (generally is $N^+$-emitter of NPN or $N^+$ of CMOS) which formed in slot area 134 is used as base to provide current for epi layer 12 through slot area 134 and buried layer 11. The contact holes of $N^+$-type area 135 and collector areas 131 and emitter area 132 are formed on oxide layers 14 which on the epi layer 12 with field effect implant layer 120. Finally, the base electrode metal 143 and collector electrode metal 141 and emitter electrode metal 142 are formed in contact holes and connected with $N^+$-type area 135 and collector areas 131 and emitter area 132, respectively.

Although the current gain and the driving capability of LPNP can be enhanced by heavier doping emitter area 132 and collector 131 and deeper $P^+$ junction in the previous art, the collector-base breakdown voltage (BVceo) and Early voltage (VA) of LPNP transistor were decreased. Owing to the limitations of LPNP performance, either big area LPNP or complicated circuit design will be needed to satisfy the request of the product.

Further, the weak point of previous LPNP is mainly caused by its base area doping is same as lightly doped NPN collector area doping. In order to reach the request of collector-base breakdown voltage (BVceo) and Early voltage (VA), the distance between emitter 132 and collector 131 must be enough, that means a wider base width is needed, but actually therefore has sacrificed the current gain. Although the current gain can be enhanced by heavier doped emitter and collector area and deeper $P^+$ junction due to the emitter emission efficiency increased at present, its effects is not obvious since the base width is the primary factor to decide the current gain (Hfe).

SUMMARY OF THE INVENTION

The main purpose of this invention is to overcome the weak point of LPNP that described above and to reduce the area of chip.

Additional purpose of this invention is to enhance the performance of products by using LPNP without special and complicated circuit design.

Further, this invention uses a composite mask to do multiple diffusions by self-alignment. Thus, the mismatch of multiple alignments could be eliminated and the width of base and collector could be controlled accurately.

This invention based on the enhanced LPNP transistor with $P^+$ doping emitter and collector, introduces the medium N-type base doping and light $P^-$-type collector doping before the $P^+$ doping to make the emitter-base-collector doping profile in lateral and base width of LPNP to be equal to NPN transistor. Thus, the designer can optimize the doping profile and area size of emitter, base and collector according to the request of the current gain (Hfe), collector-base breakdown voltage (BVceo), and Early voltage (VA) of LPNP transistor.

In addition, the doping windows of Isolation/$P^-$/N-type base/$P^+$ layers are formed on one oxide layer by composite mask in one time for self-align manufacturing LPNP transistor in this invention.

According to the defined method as described above, self-alignment process is proceeded to eliminate the misalignment between multi layers. Thus, the current gain (Hfe) of LPNP transistor can be optimized and accurately controlled by the doping concentration and depth of N-type base and $P^+$ emitter which diffused by two times through the same doping window. Also, the collector-base breakdown voltage (BVceo) can be optimized and accurately controlled by the distance between collector window and emitter window which formed in one time, and $P^-$ collector doping concentration and depth.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE PREFERRED EMBODIMENT

Figure 1:
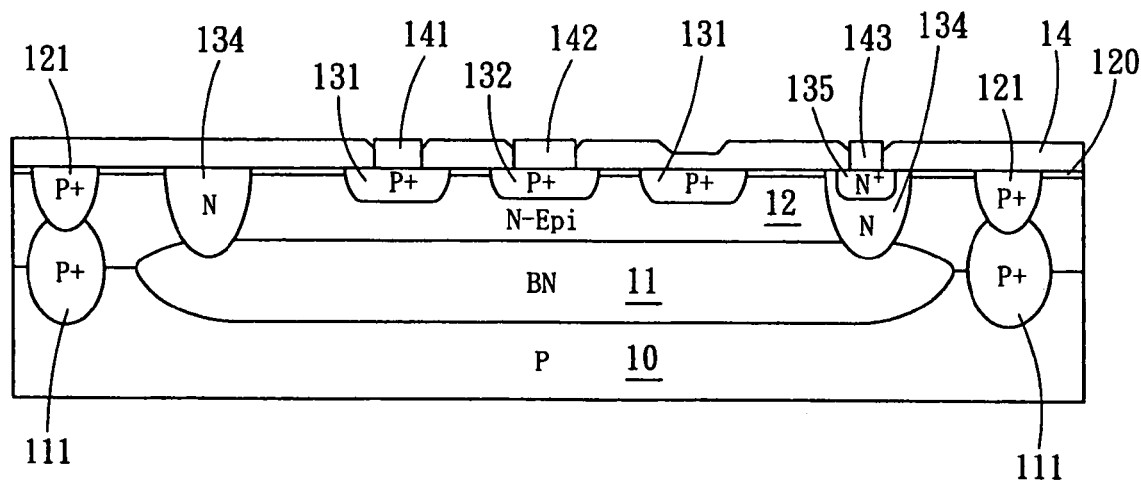
FIG. 1 is a cross-sectional view of a conventional LPNP transistor structure.
Figure 2:
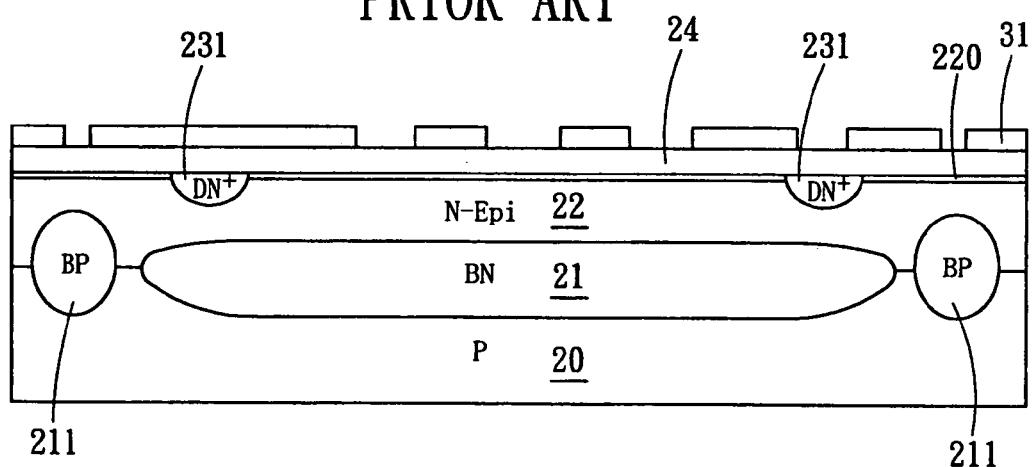
FIGS. 2~FIG. 10 is a cross-sectional view of LPNP transistor structure with manufacturing steps in this invention.

Referring to FIGS. 2-10, the descriptions of these figures are shown as below:

Referring now to the FIG. 2, an N-type buried layer 21, which is made by N-type implant and drive-in, is formed on the surface of P-type doping substrate 20. These layers all formed according to well-known semiconductor processing techniques. The P-type buried layers 211, which is made by P-type implant and drive-in processes, surround around the N-type buried layer 21. Next, the N-type epi layer 22 and N-type field implant layer 220 are formed sequentially on the surface of substrate 20, N-type buried layer 21, and P-type buried layers 211. Furthermore, the deep N$^+$-type sinker areas, which are made by photolithography, etch, and N$^+$-sinker doping processes downward the surface of field implant layer 220, formed on top of the buried layer 21. Next, the oxide layer 24 is formed on the N-type field implant layer 220. Finally, the resist mask layers 31, which define the regions of LPNP transistor and isolation areas, are made by photolithography process.

Figure 3:
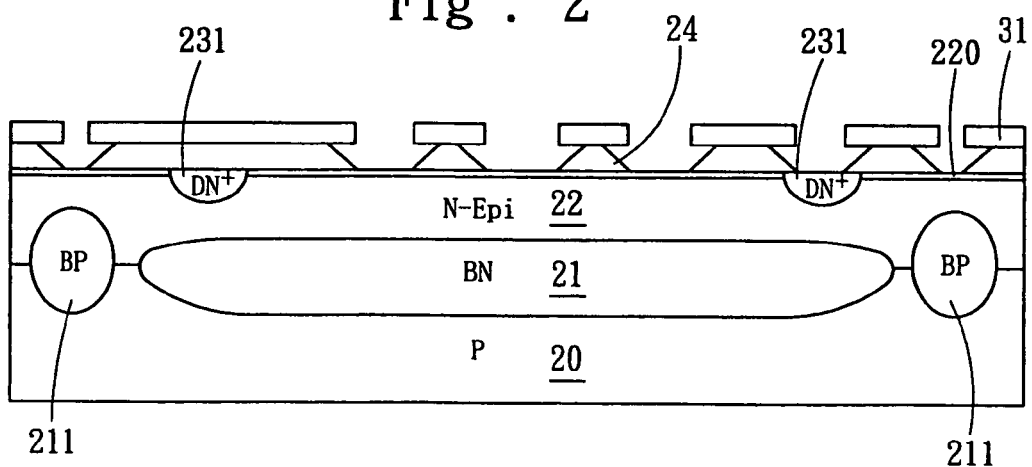
Figure 4:
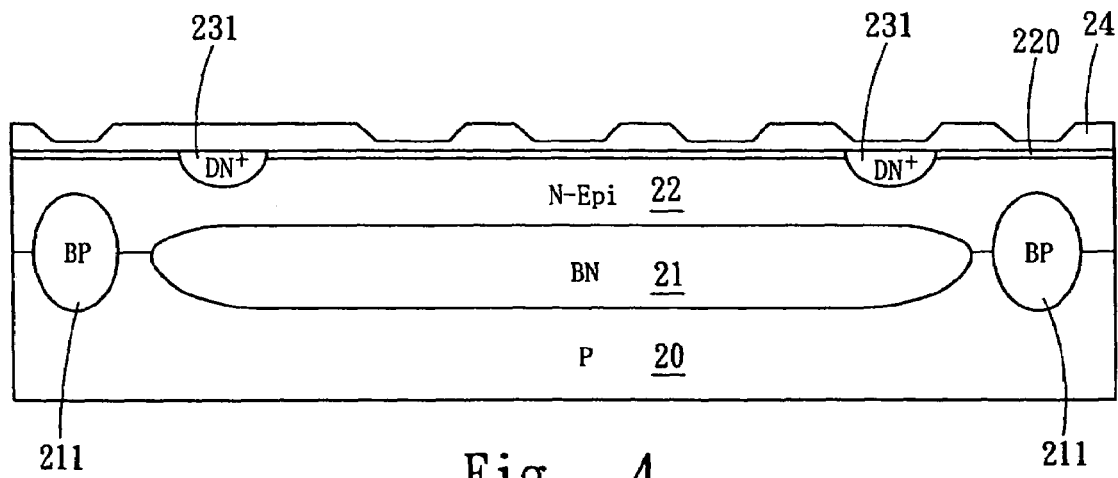

The oxide layer 24 is etched to the surface of N-type field implant layer 220 through mask layer 31 (FIG. 3). Next, the resist mask layer 31 is removed and the oxide layer 24 will be the shielding mask layer for the following processes (FIG. 4).

Figure 5:
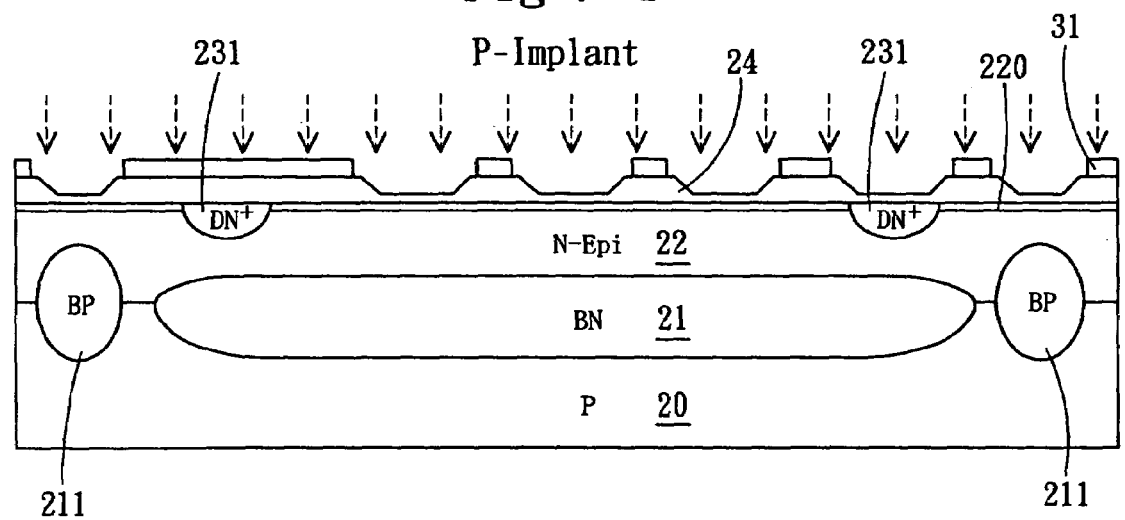
Figure 6:
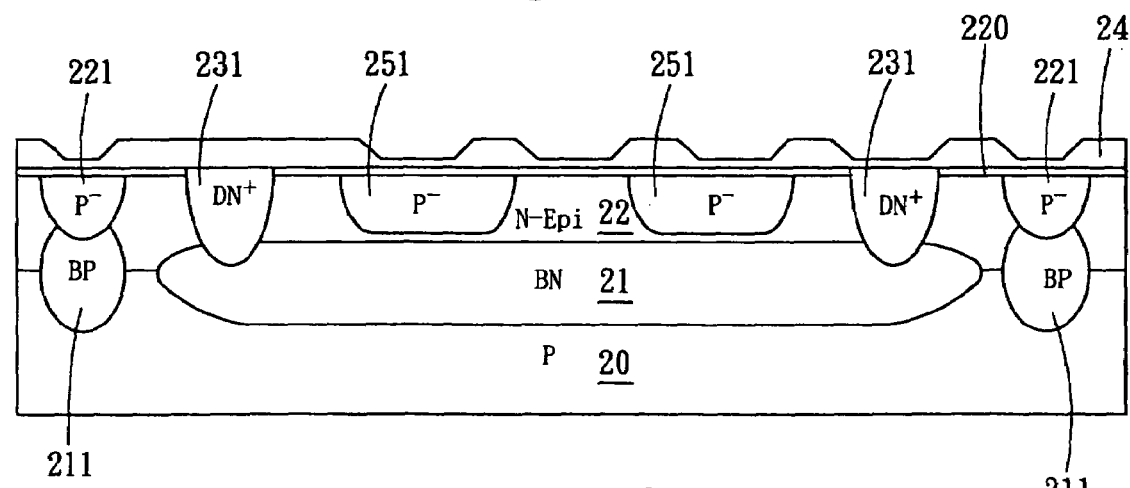

The resist mask layer 32 is defined on the oxide mask layer 24 by photolithography and P-type implantation is used for P$^-$ doping (FIG. 5). After removing the resist mask layer 32, the P$^-$-type collector 251 is formed downward from the surface of epi layer 22 by drive-in process and the P$^-$-type isolation area 221 which surround around the buried layer 21 is extended downward to connect with P-type buried layer 211. Furthermore, the deep N$^+$-type sinker 231 will extend downward to connect to the edge of the buried layer 21 owing to the heat treatment (FIG. 6).

Figure 7:
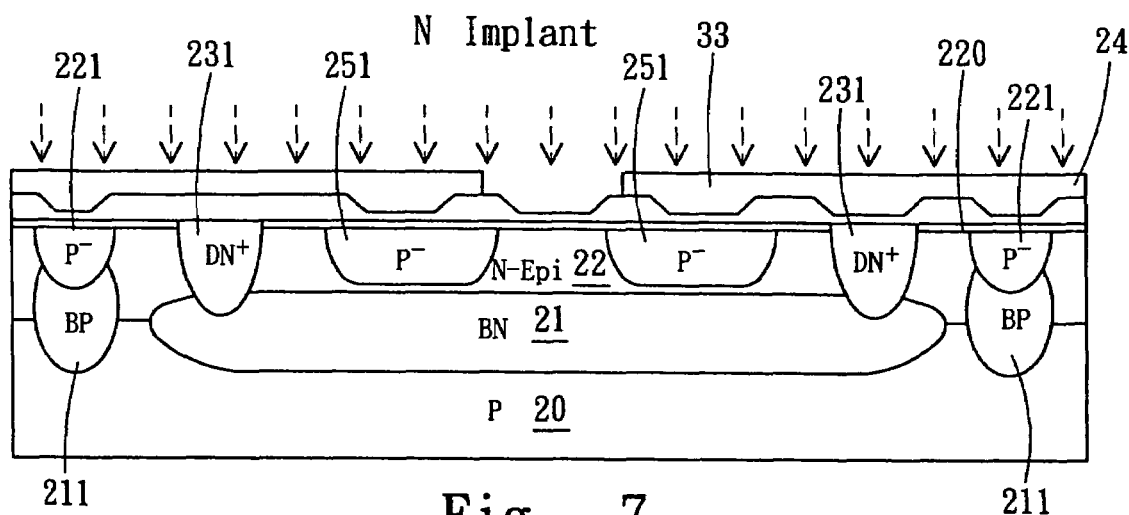
Figure 8:
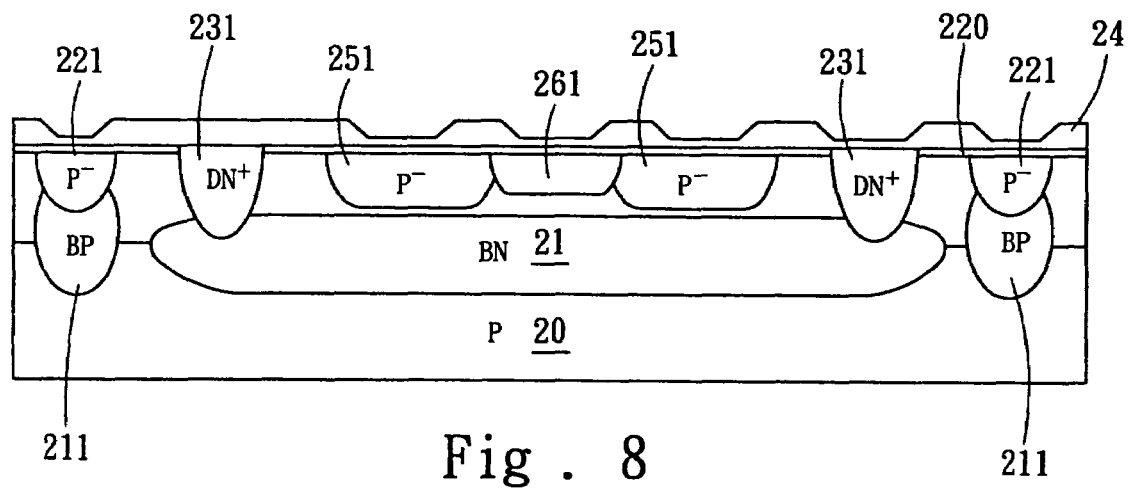

Next, the resist mask layer 33 is defined on the oxide mask layer 24 by photolithography and N-type implantation is used for N-base doping (FIG. 7). After removing the resist mask layer 33, the N-type base 261 is formed downward from the surface of epi layer 22 by drive-in process. The N-type base 261 is surrounded by P$^-$-type collector 251 (FIG. 8).

Figure 9:
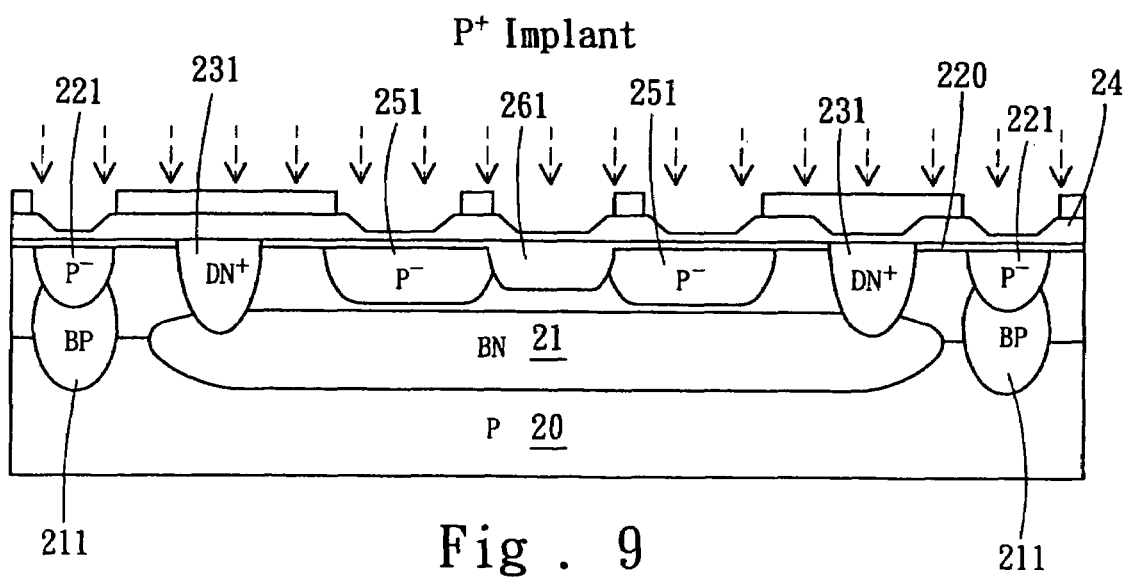
Figure 10:
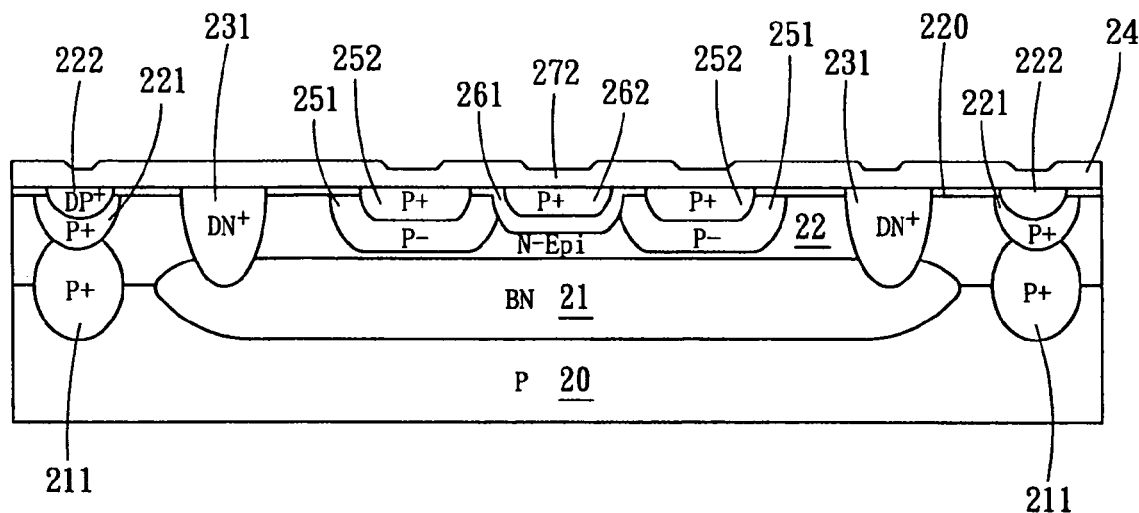

Next, the resist mask layer 33 is defined on the oxide mask layer 24 by photolithography and P-type implantation is used for P$^+$ doping (FIG. 9). After removing the resist mask layer 33, the P$^+$ collector 252 and the P$^+$ isolated area 222 and the P$^+$ emitter 262 is formed downward from the surface of N-type field implant layer 220 on epi layer 22 by drive-in and oxidation process, while not to exceed the P$^-$-type collector 251, P$^-$-type isolated area 221, and N-type base 261 respectively (FIG. 10).

Figure 11:
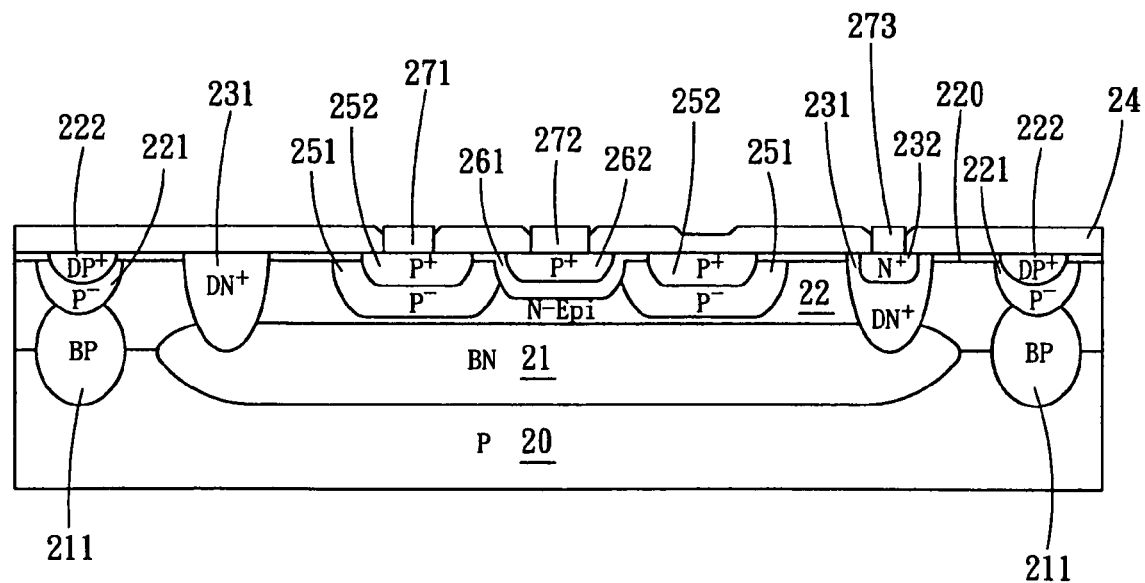
FIG. 11 is a cross-sectional view of LPNP transistor structure of this invention.

Furthermore, the N$^+$-type base 232 is formed on the deep N$^+$-type sinker 231 by N$^+$ implantation. The contact holes, which connect with P$^+$ collector 252, N$^+$-type base 232, and P$^+$ emitter 262, are formed on the oxide mask layer 24 by photolithography and etch processes. Finally, the metal electrode of collector 271, metal electrode of base 273, and metal electrode of emitter 272 are formed and to connect with P$^+$ collector 252, N$^+$-type base 232, and P$^+$ emitter 262, respectively. The cross sectional view of LPNP transistor of this invention is shown in FIG. 11.

To conclude the manufacturing processes described above, the doping windows of Isolation/P$^-$/N-type base/P$^+$ layers used for LPNP transistor in this invention are formed on one oxide layer 24 by composite mask in one time. According to the defined method as described above, self-alignment process is proceeded to eliminate the misalignment between multi layers. Thus, the current gain (Hfe) of LPNP transistor can be optimized and accurately controlled by the doping concentration and depth of N-type base 261 and P$^+$ emitter 262 which diffused by two times through the same mask window. Also, the collector-base breakdown voltage (BVceo) can be optimized and accurately controlled by the distance between collector window and emitter window which formed in one time, and P$^-$ collector 251 doping concentration and depth.

Therefore, the emitter-base-collector doping profile in the lateral and the base width of LPNP transistor were similar to NPN. Thus, the area of chip can be reduced and the performance of LPNP can be optimized without the requirement to special and complicated circuit design.

Figure 12:
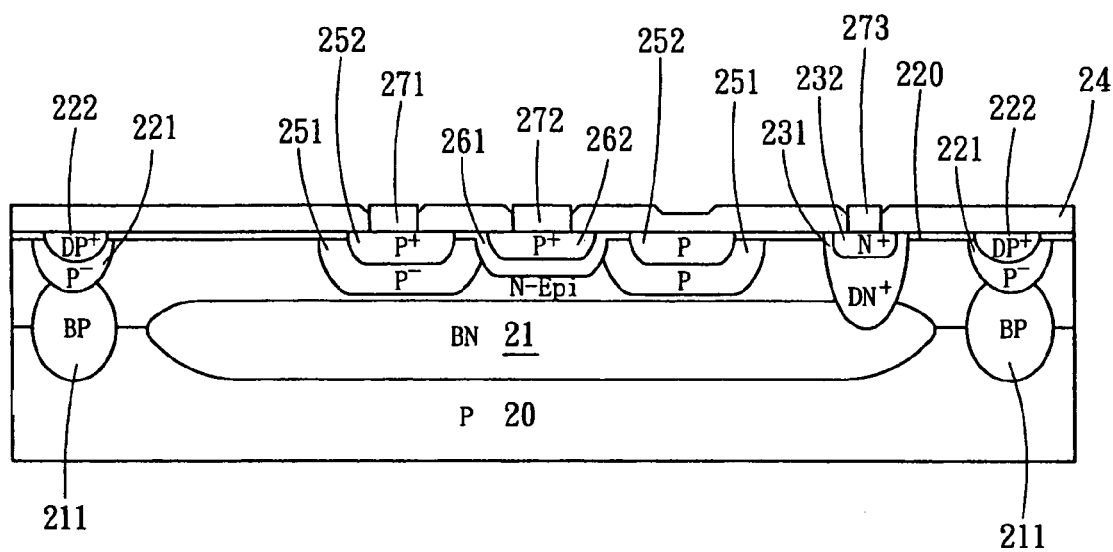
FIG. 12 is a cross-sectional view of LPNP transistor structure with one-side N$^+$-sinker in this invention.
Figure 13:
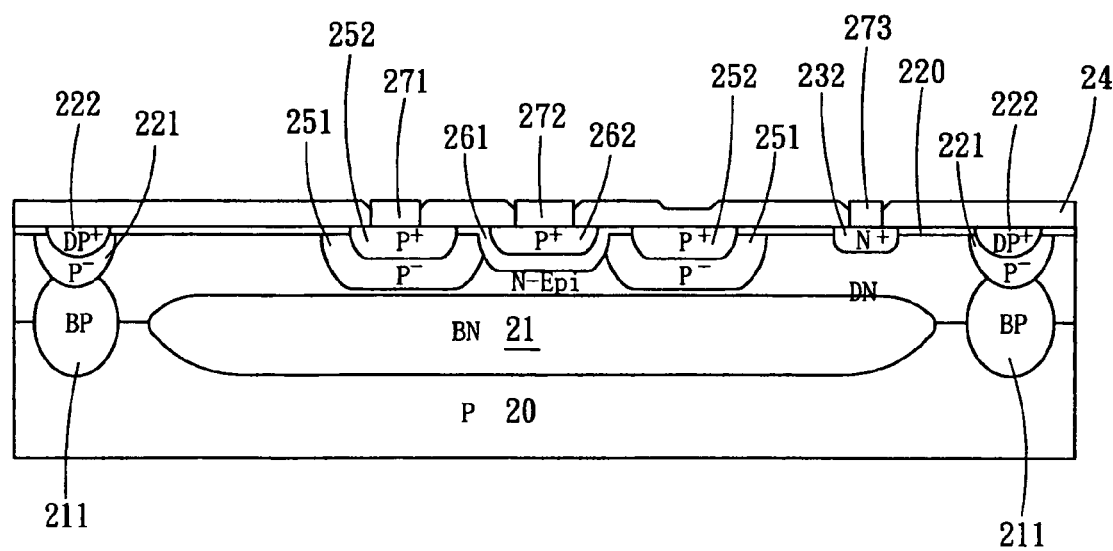
FIG. 13 is a cross-sectional view of LPNP transistor structure without N$^+$-sinker slot area in this invention.

In addition, the structure of LPNP transistor with surrounding deep N$^+$-type sinker 231 in this invention is a sample with minimum base resistance and largest device area. To reduce device area, the one-side deep N$^+$-type sinker of LPNP transistor could be used and the structure is shown in FIG. 12. To further reduce device area and mask layer of process, the LPNP transistor without deep N$^+$-type sinker could be used and the structure is shown in FIG. 13.

A better understanding of the present invention may be obtained in light of the examples as described above which are set forth to illustrate, but are not intended to be in any way limiting to the scope of the invention as claimed. It is intended to claim all such changes and modifications that fall within the true scope of the invention.

What is claimed is:

1. A manufacturing method of a lateral PNP (LPNP) transistor, wherein a N-type buried layer (buried N) is formed on a P-type substrate and is to be surrounded by a P-type buried layer (buried P); and forming a N-type epi layer and a N-type field implant layer sequentially on the surfaces of P-type substrate, N-type buried layer and P-type buried layer; and doping downward a deep N$^+$-type sinker from the surface of N-type field implant layer on the up edge of buried layer, then opening the doping windows for LPNP areas and isolation area at shielding oxide layer grown on N-type field implant layer; and forming P$^-$-type collector downward from the surface of the N-type epi layer and P$^-$-type isolation area which surrounds N-type buried layer and downward extended to connect with P-type buried layer by P$^-$ implantation and drive-in process, at this time, the deep N$^+$-type sinker will extend downward to connect with the edge of N-type buried layer by drive-in process; and the N-type base, which is surrounded by P⁻-type collector, is formed downward from the surface of the N-type epi layer by N implantation process, and the P⁺ implantation into the needed area and drive-in to form P⁺ collector and P⁺ isolated area and P⁺ emitter downward from N-type field implant layer, while do not surpass the P⁻-type collector, P⁻-type isolated area, and N-type base respectively; and the N⁺-type base area is formed on the deep N⁺-type sinker via N⁺ implantation process; and the contact holes are formed at P⁺ collector area, N⁺-type base area, and P⁺ emitter area by photolithography and etching process; and finally forming metal electrodes of collector, base and emitter on said contact;

wherein the doping windows of isolation/P⁻/N-type base/P⁺ layers are defined on shielding oxide layer at the same time by a composite mask, and wherein the N-type base is formed to be sandwiched by the P⁺ emitter and the N-type epi layer.

2. The method of claim 1, wherein the isolation is formed by stacking P⁻-type doping layer and P⁺ doping layer.

* * * * *